United States Patent [19]
Palnitkar et al.

[11] Patent Number: 5,539,680
[45] Date of Patent: Jul. 23, 1996

[54] METHOD AND APPARATUS FOR ANALYZING FINITE STATE MACHINES

[75] Inventors: Samir S. Palnitkar; Prasad V. Saggurti, both of Sunnyvale; Ser-Hou Kuang, San Jose; Chee-Keng Chang, Mountain View; Guillermo Maturana, Berkeley, all of Calif.

[73] Assignee: Sun Microsystem, Inc., Mountain View, Calif.

[21] Appl. No.: 285,932

[22] Filed: Aug. 3, 1994

[51] Int. Cl.$^6$ .................................... G06F 17/16
[52] U.S. Cl. ............................................ 364/578
[58] Field of Search ......................... 364/578, 553, 364/191, 488, 491, 579, 580; 371/62, 23, 22.3, 27; 395/800, 500, 920, 922

[56] References Cited

U.S. PATENT DOCUMENTS

| | | | |
|---|---|---|---|
| 4,727,549 | 2/1988 | Tulpule et al. | 371/62 |
| 5,038,307 | 8/1991 | Krishnakumar et al. | 364/578 |
| 5,146,460 | 9/1992 | Ackerman et al. | 371/23 |
| 5,329,533 | 7/1994 | Lin | 371/22.3 |
| 5,392,227 | 2/1995 | Hiserote | 364/578 |
| 5,394,347 | 2/1995 | Kita et al. | 364/578 |
| 5,418,793 | 5/1995 | Chang et al. | 371/27 |
| 5,442,569 | 8/1995 | Osano | 364/578 |
| 5,450,598 | 9/1995 | Kaplan et al. | 395/800 |
| 5,453,940 | 9/1995 | Broomhead et al. | 364/553 |

OTHER PUBLICATIONS

"Finite State Machine Analysis Program", by S. Palnitkar, P. Saggurti and S. Kuang, IEEE, Verilog HDL, 1994 Conference, Jul. 1994, pp. 52–57.

"A Structural Optimization Method for Symbolic FSMs", by B. Rouzeyre, G. Sagnes and G. Tarroux, IEEE, European Design Automation Conference, Mar. 1992, pp. 232–236.

"Computer Aided Test Synthesis for a Parallel Scan Design of Finite State Sequential Machines", by S. Iyengar, R. Dandapani and S. Reddy, IEEE Region 5 Conference 1988: Spanning the Peaks of Electrotechnology, 1988, pp. 152–156.

*Primary Examiner*—Kevin J. Teska
*Assistant Examiner*—Russell W. Frejd
*Attorney, Agent, or Firm*—Blakely Sokoloff Taylor & Zafman

[57] ABSTRACT

A computer system for generating a summary of test coverage for a hardware description. The hardware description corresponds to a finite state machine (FSM). This embodiment requires at least one test vector. The computer system comprises a memory and a processor. The memory is for storing the hardware description and the test vector. The processor, coupled to the memory, uses the hardware description and generates state information corresponding to the FSM. The processor, using the state information, further generates a first description. The first description includes a description for monitoring states and signals in the hardware description. The processor, using the test vector, the hardware description and the first description, further generates the test coverage summary.

17 Claims, 4 Drawing Sheets

METHOD AND APPARATUS FOR ANALYZING FINITE STATE MACHINES

BACKGROUND OF THE INVENTION

1. Field of Invention

The present invention relates to the field of hardware design verification. In particular, the present invention describes a method and apparatus for analyzing and verifying finite state machines (FSM).

2. Description of Related Art

BACKGROUND

Many electronic circuits, like microprocessors and microcontrollers, are designed with high level hardware description languages like Verilog, and VHDL. See "The Verilog HDL Language Reference Manual," Open Verilog International, 1992, and "IEEE 1076–1987 Standard VHDL Language Reference Manual", March 1988, for further information on these languages. To save time and money, designers prefer to verify their designs prior to fabricating their circuits. One aspect of the verification process includes verifying the finite state machines (FSM) incorporated in a hardware description. This process includes simulating the FSM's operation with a number of test vectors. Test vectors, or driver data, are stimuli for the simulator and are well known.

A finite state machine is a description of a physical process that includes states. That is, an FSM provides a solution to a sequential physical problem. The sequential physical problem requires that before some output is allowed, a specific set of inputs must have been received in a sequential manner. The FSM generates outputs according to past information and present inputs. Microcontrollers and microprocessors work in this manner.

Each FSM includes a number of states and a number of arcs between the states. The arcs define the transitions between the states. A particular arc is taken from a particular state, depending upon the inputs to the finite state machine. Finite state machines are described in, W. I. Fletcher, "An Engineering Approach to Digital Design," 1980 (Prentice-Hall: Englewood Cliffs, N.J.).

To verify FSMs, prior art analyzers have depended on post processing to determine the test coverage of a set of test vectors. That is, for a given FSM design, and a given set of test vectors, a large dump file is generated. This dump file contains information about the state of numerous signals in the hardware description. The post processing extracts statistical information from the dump file and generates a summary of the coverage of the test vectors. Typically, the summary includes the arcs traversed, the arcs missed, the states accessed, states missed, etc. This summary provides an indication of how well the test vectors covered all the states and arcs in the FSM (the sufficiency of the test coverage). The best test coverage will include the accessing of all the states and the traversing of all the arcs.

These prior art systems have a number of drawbacks. The dump files are very large. Creating, and then reading, these files takes a considerable amount of time. For example, a typical regression of 50000 cycles for a FSM with seven states and five inputs will require the time to create a dump file of 100 Mbytes. This example is for a relatively small FSM; there can be hundreds of larger FSMs in a large design. This takes time away from a designer's ability to experiment with the hardware description. Therefore, it is desired that FSM analysis occur without the need for post processing, and in particular, without the need for post processing a large simulation dump file.

Another prior art analyzer requires the designer to generate a separate file defining valid state transitions in a state table format. This state information defines the FSM. This requires additional work on the designer's part. For example, the MEG analyzer, available from University of California, Berkeley, requires the further definition of the FSM using state tables or the like. See Hamachi, G. "Designing Finite State Machines with PEG." in: 1986 VLSI Tools: Still More Works by the Original Artists (EECS, University of California, Berkeley, 1985, Report No. UCB/CSD 86/272), and the "Berkeley CAD Tools User's Manual", Ibid., for further information on MEG. The user must input the state table to the analyzer. Ideally, a designer should not be burdened with having to define such state table information. The designer should be allowed to define the hardware description and have the FSM verified without also having to define the FSM state table information. Therefore, it is preferred that the state table be automatically generated.

Further, the prior art systems, like MEG, use programming language interface (PLI) routines. These routines are used to enhance the capabilities of Verilog by defining a designer's own functions. However, often PLI routines are not compiled; therefore, analyzers using these routines execute substantially slower than analyzers not using these routines. Therefore, it is desired that an analyzing tool be implemented using Verilog compiled code rather than PLI routines.

Therefore, what is desired is an improved method and apparatus for analyzing finite state machines (FSM).

SUMMARY OF THE INVENTION

A method and apparatus for analyzing finite state machines (FSM) is described. The present invention removes the need to generate a large dump file in response to simulating a hardware description with test vectors. One embodiment includes a computer system for generating a summary of test coverage for a hardware description. The hardware description corresponds to a finite state machine (FSM). This embodiment requires at least one test vector. The computer system comprises a memory and a processor. The memory is for storing the hardware description and the test vector. The processor, coupled to the memory, uses the hardware description and generates state information corresponding to the FSM. The processor, using the state information, further generates a first description. The first description includes a description for monitoring states and signals in the hardware description. The processor, using the test vector, the hardware description and the first description, further generates the test coverage summary.

In another embodiment, the hardware description is written in Verilog code and the processor executes a design compiler to extract the state information. The processor uses a hardware simulator to generate the summary information. Thus, this embodiment has the advantage of integrating well with presently available systems.

In another embodiment, the processor is further for accessing a second summary, and the processor is further for generating a third summary corresponding to the summary, and the second summary. The second summary corresponds to at least one other test vector. Thus, the third summary corresponds to a summary of the coverage of at least the first test vector and the second test vector.

BRIEF DESCRIPTION OF THE DRAWINGS

The present invention is illustrated by way of example, and not limitation, in the figures. Like references indicate similar elements.

DESCRIPTION OF THE PREFERRED EMBODIMENT

OVERVIEW

A method and apparatus for analyzing finite state machines (FSM) is described. In the following description, numerous specific details are set forth such as monitor file content, etc., in order to provide a thorough understanding of the present invention. It will be obvious, however, to one skilled in the art that the present invention may be practiced without these specific details. In other instances, well-known hardware description language constructs, circuits, structures and techniques have not been shown in detail in order not to unnecessarily obscure the present invention.

COMPUTER SYSTEM

Figure 1:
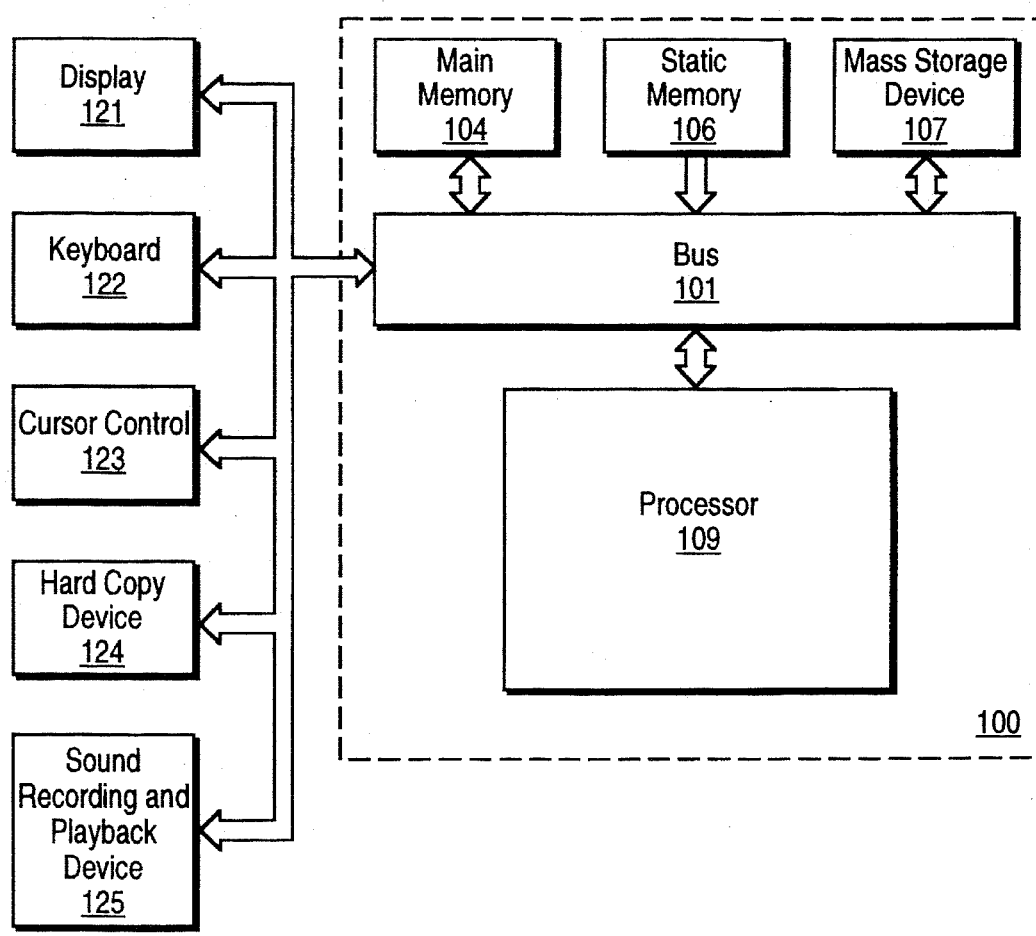
FIG. 1 illustrates a computer system upon which the present invention may be implemented.

Referring to FIG. 1, a computer system upon which an embodiment of the present invention can be implemented is shown as 100. Computer system 100 comprises a bus 101, or other communications hardware and software, for communicating information, and a processor 109 coupled with bus 101 for processing information. System 100 further comprises a random access memory (RAM) or other dynamic storage device 104 (referred to as main memory), coupled to bus 101 for storing information and instructions to be executed by processor 109. Main memory 104 also may be used for storing temporary variables or other intermediate information during execution of instructions by processor 109. Computer system 100 also comprises a read only memory (ROM) 106, and/or other static storage device, coupled to bus 101 for storing static information and instructions for processor 109. Data storage device 107 is coupled to bus 101 for storing information and instructions.

Furthermore, a data storage device 107, such as a magnetic disk or optical disk, and its corresponding disk drive, can be coupled to computer system 100. Computer system 100 can also be coupled via bus 101 to a display device 121 for displaying information to a computer user. Display device 121 can include a frame buffer, specialized graphics rendering devices, a cathode ray tube (CRT), and/or a flat panel display. An alphanumeric input device 122, including alphanumeric and other keys, is typically coupled to bus 101 for communicating information and command selections to processor 109. Another type of user input device is cursor control 123, such as a mouse, a trackball, a pen, a touch screen, or cursor direction keys for communicating direction information and command selections to processor 109, and for controlling cursor movement on display 121. This input device typically has two degrees of freedom in two axes, a first axis (e.g., x) and a second axis (e.g., y), which allows the device to specify positions in a plane. However, this invention should not be limited to input devices with only two degrees of freedom.

Another device which may be coupled to bus 101 is a hard copy device 124 which may be used for printing instructions, data, or other information on a medium such as paper, film, or similar types of media. Additionally, computer system 100 can be coupled to a device for sound recording, and/or playback 125, such as an audio digitizer coupled to a microphone for recording information. Further, the device may include a speaker which is coupled to a digital to analog (D/A) converter for playing back the digitized sounds.

Also, computer system 100 can be a terminal in a computer network (e.g., a LAN). Computer system 100 would then be a computer subsystem of a computer system including a number of networked devices.

FINITE STATE MACHINE (FSM)

Figure 2:
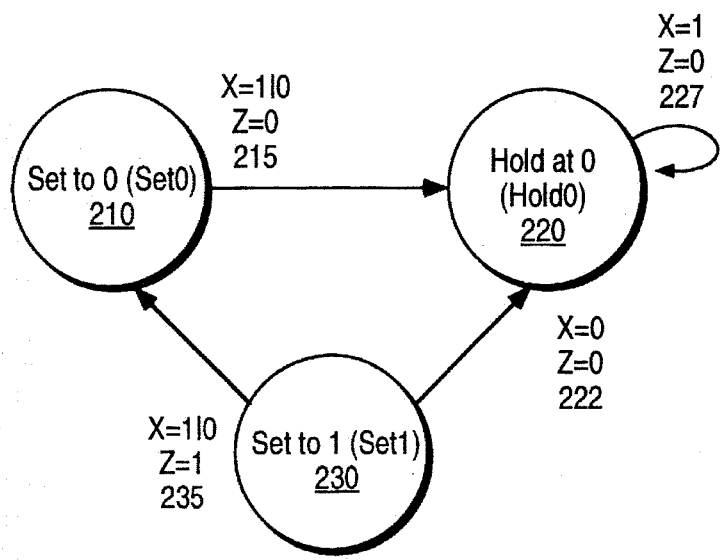
FIG. 2 illustrates an example of a finite state machine (FSM).

An example of a finite state machine is shown in FIG. 2. For the purpose of this example, assume the state machine of FIG. 2 represents a discrete logic circuit for turning a light on for a set period of time and then off. Note that this figure illustrates a Mealy model of an FSM, however the present invention should not be restricted to only Mealy models of FSMs. The FIG. 2 state machine includes three states: Set0 210, Hold0 220 and Set 1 230. Set0 210 is connected to Hold0 by arc 215. Hold0 220 is connected to Set1 230 by arc 222. Set1 230 is connected to Set0 210 by arc 235. Hold0 220 has another arc, arc 227, connected back to Hold0 220.

At initialization, the circuit will begin at state Set0 210. No matter what the value of the input, X, the output Z will be set to 0 (the light is off). The next state will always be Hold0 220, arc 215.

At state Hold0 220, the next state depends on the value of the input, X. If X=1, then arc 227 is traversed, and the next state is Hold0 220. Returning to the light example, assume that Z=0 means the light is off. If at state Hold0 220, X=1, then the Z remains at 0, and the discrete logic circuit will keep the light off. If X=0, then arc 222 is traversed to state Set1 230. Traversing arc 222 causes Z=0.

At state Set1 230, the next state is not dependent upon the input X. That is, the next state will always be Set0 210, arc 235. However, traversing arc 235 represents the discrete logic circuit turning the light on, Z=1. The next state is Set0 210. Traversing arc 215, sets Z=0, and turns the light off again. Thus, the light is turned on in response to a stimulus (X=0 at state Hold0 22), and then turned off again.

Further for the purposes of example, assume that a designer has written a hardware description of the discrete logic circuit. Typically, the hardware description includes a language description of an electronic circuit and/or an FSM for a physical process. To test whether the description, and therefore the hardware, will cause the light to turn on and turn off at the correct times, the designer will write a set of test vectors that will test the function of the hardware. That is, test vectors and the hardware description are used as input to a simulator.

To verify that the state machine of the hardware description works as desired, the test vectors should access all three states, and should traverse all four arcs. For small systems like the hardware required to implement the FSM of FIG. 2, this can be relatively simple. However, for large systems like microprocessors, thousands of states and arcs may be represented in the hardware description. The present invention streamlines the process of testing FSMs.

FLOW OF FSM ANALYZER

Figure 3:
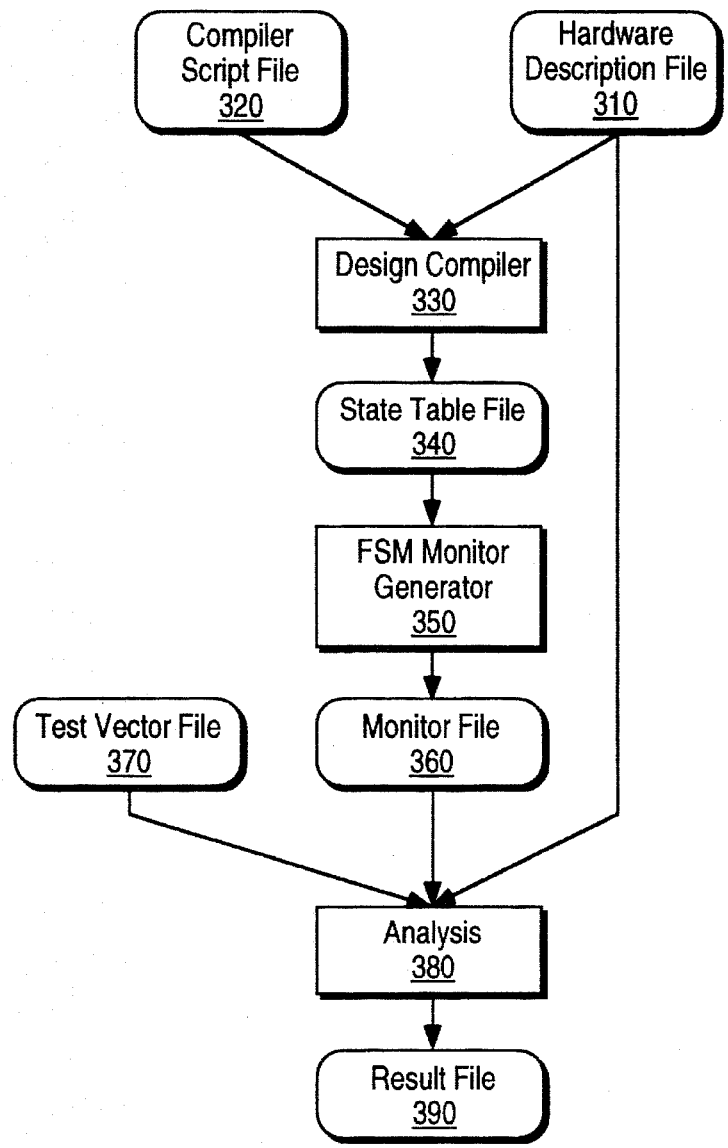
FIG. 3 is a flow diagram showing a method of analyzing a FSM to generate a result file.

FIG. 3 is a flow diagram showing a method of analyzing a FSM to generate a result file. This flow diagram represents one embodiment of the present invention for streamlining the process of testing FSMs. In one embodiment, this flow diagram represents the processes executed by processor 109 and the data stored in at least one of the memory units, main memory 104, static storage device 106, or data storage device 107. In FIG. 3, square corner rectangles indicate processes, rounded corner rectangles indicate data. The hardware description file 310, the design compiler 330, the state table 340, the test vector file 370, and the analysis 380 are elements that are used in other systems for designing and testing FSMs, and, therefore are well known to persons skilled in the art.

The process begins with a hardware description file 310. This file typically contains a register transfer language (RTL) description of one or more FSMs. One of ordinary skill in the art would understand how to generate an RTL description of an FSM given the discussion herein. Appendix A includes an example Verilog-XL™ (Verilog-XL™ is a trademark of Cadence Design Systems Inc.) hardware description of the FSM of FIG. 2. In one embodiment, the Verilog-XL™ description language, version 1.6, from Cadence Design Systems Inc. of San Jose, Calif., is used. Note, in another embodiment of the present invention, VHDL is used to describe the FSM.

A compiler script file 320 can optionally be provided. The script automates the process of generating a state table file 340. This script uses Unix shell commands and one of ordinary skill in the art would understand how to generate such a script file given the description herein. If a script is not provided, then the designer must manually enter the commands to extract the state information. The design compiler 330 uses the hardware description file 310 to extract a state table representing the corresponding FSM. A suitable design compiler 330 which may be utilized is the Synopsys™ design compiler, available from Synopsys Inc. of Mountain View, Calif. See the "Synopsys Design Compiler Reference Manual, Version 2.2." Mountain View, Calif., Synopsys Inc., December 1991. The design compiler generates the state table file 340. The state table file 340 is one representation of the FSM defined in the hardware description file 310. The description of the format of a typical state table can be found in the Synopsys™ Design Compiler Reference Manual, Appendix E. Other representations of FSMs are supported directly. That is, state table file 340 may be replaced by another representation of an FSM. In another embodiment, other FSM representations are first translated into the Synopsys™ state table format before being accessed by FSM monitor generator 350.

The state table, describing the FSM, is automatically generated by design compiler 330. This is a significant improvement over the prior art in that a designer does not have to separately define a state table describing the FSM. Appendix B includes an example state table generated using a Synopsys™ design compiler, version 2.2b. This example state table corresponds to the FSM of FIG. 2.

The FSM monitor generator 350 accepts, as input, the state table file 340. First, FSM monitor generator 350 parses the necessary FSM information from state table 340. Typically, this information includes the number of states, the arcs between the states, and the input and output values for each arc. In one embodiment, a Unix yacc grammar file is used in the parsing of the state table file 340. One of ordinary skill in the art will understand how to write such a parser given the description contained herein. Further, the technique of creating a suitable Unix yacc grammar file should be well known to a person of ordinary skill in the art.

Next, FSM monitor generator 350 produces the data structures needed to represent the FSM. These data structures include the parsed FSM information. These data structures hold a representation of the FSM which is then used to create the monitor file 360. Data structures used include: a table of all arcs, represented by a two dimensional array; a valid arc lookup table; a current arc structure; and a listing of all the arcs. In Verilog, the two dimensional arrays are modeled as memories. The valid arc lookup table includes three sets of two dimensional arrays: present state names array; next state names array; and present input names array. The current arc structure is modeled as having the following fields: state width for indicating the number of bits in a state; input width for indicating the number of inputs in an arc; present state for holding the previous value of the state register; next state for holding the current value of the state register; present inputs for holding the number of current inputs; and traversed value for specifying how many times an arc has been traversed. The listing of arcs is modeled as a 2-dimensional array. Each register (row) has an arc represented as a concatenation of the present inputs, the present state, and the next state. Each state is modeled as having: state value for indicating the number of bits which make up a state; begin index for indicating the begin index of all the arcs in the list of arcs which have this state as a current state; and end index for indicating the ending index of all the arcs in the list of arcs which have this state as the current state.

Using these data structures, FSM monitor generator 350 generates a file containing user-created tasks, monitor file 360. Monitor file 360 contains Verilog hardware description language code, however, in other embodiments of this invention, monitor file 360 can contain any code capable of executing during a simulation of the hardware description file 310. These tasks are later used to monitor states and signals in the hardware description file 310 during a simulation. That is, FSM monitor generator 350 generates a part of a program, monitor file 360. This part of a program executes during a simulation of the hardware description file 310, causing the FSM test coverage information to be extracted during the simulation process. What is particularly important about the above steps is that the monitor file 360 is automatically generated and can be used to track information about an FSM. Monitor file 360 is relatively small compared to a dump file. This reduces the overall time required to verify an FSM. Further discussion of the creation of this file is found below.

Once the monitor file 360 has been generated, the monitor file 360, the hardware description file 310, and a test vector file 370, are provided for analysis 380 (simulation). Analysis 380 is a simulator, executing on processor 109, available from Cadence Design Systems Inc. of San Jose, Calif. (Verilog-XL™ simulator, version 1.7). However, in another embodiment, analysis 380 is any simulator capable of simulating the information in the hardware description file 310. The test vector file 370 (or driver file), typically contains test vectors for a simulator. In one embodiment, test vector file 370 is the test vector file of prior art systems. That is, in prior art systems, test vector file 370 is used as stimulus to create a large dump file, which is then used in the post processing FSM verification.

Analysis 380 includes the process of simulating the hardware described in the hardware description file 310. The analysis 380 generates a result file 390 during the simulation process. Note, a large dump file and then post processing the dump file are not needed. Also, generating the results during the simulation greatly reduces the time required to determine test coverage and allows the designer to more quickly test an FSM design.

The result file 390 typically includes: states accessed; states not accessed; arcs traversed; the number of times an arc has been traversed, and arcs missed. In another embodiment of the present invention, three files are produced: the result file as described above; an error file containing information on the traversal of illegal arcs, and a log file containing a log of the simulation.

Of particular importance, in the above described process, is that only a small FSM monitor file 360 and a small result file 390 need be generated. Further, if a designer wishes to simulate the hardware with a second set of test vectors, then the designer can simply reuse the monitor file 360. That is, a designer need only repeat the analysis 380 with a different test vector file 370.

In the above embodiments, specific compilers, simulators, and description languages have been described; however, the present invention is not limited to such specific requirements. Further, although these embodiments indicate that files are used as inputs and outputs, other data holding and communicating devices can be used.

POST PROCESSING

Figure 4:
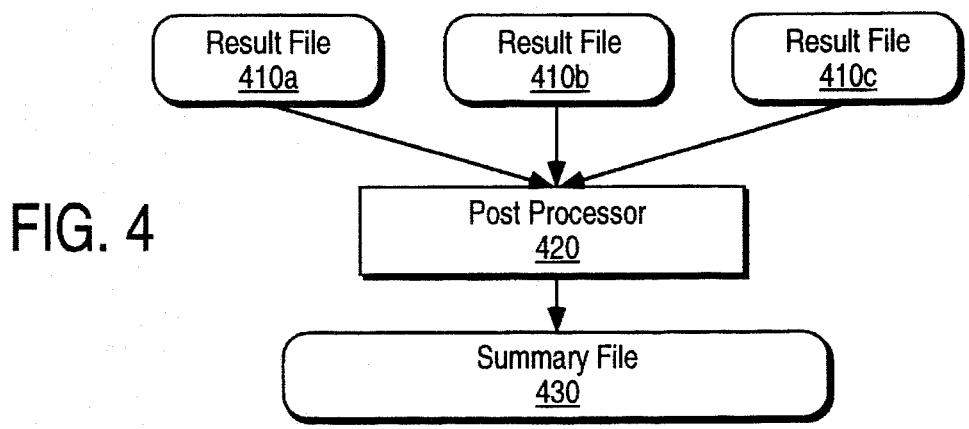
FIG. 4 is a flow diagram showing a method of performing post processing on a number of result files to generate a summary file.

FIG. 4 is a flow diagram showing a method of performing post processing on a number of result files to generate a summary file.

In one embodiment of the present invention, a post processor is used to generate a summary of a number of result files. These result files are based on the same format as result file 390.

A number of result files, 410a–410c, are used as input to post processor 420. Post processor 420 extracts the information from the result files 410a–410c to generate a summary file 430. Each of the result files 410a–410c represents a result file 390 for a given test vector file. Typically, a designer will generate multiple test vector files 370 and will execute analysis 380 for each of these files. Thus, separate result files will be generated. Each of these result files represents the test coverage for the corresponding test vector 370. Post processor 420 then provides a summary of the test coverage for the combination of the test vector files. Because each result file 410a–410c is in the format of result file 390, these files are relatively small compared to the large dump files created in prior art systems. Thus, this form of processing provides test coverage summaries of a number of test vector files quickly and efficiently.

In another embodiment of the present invention, the summary file 430 can be used as an input to post processor 420. This allows the creation of summaries of summaries.

Note that although three files have been used as input to the post processor 420, the post processing can be performed on two or more files.

MONITOR GENERATOR

Figure 5A:
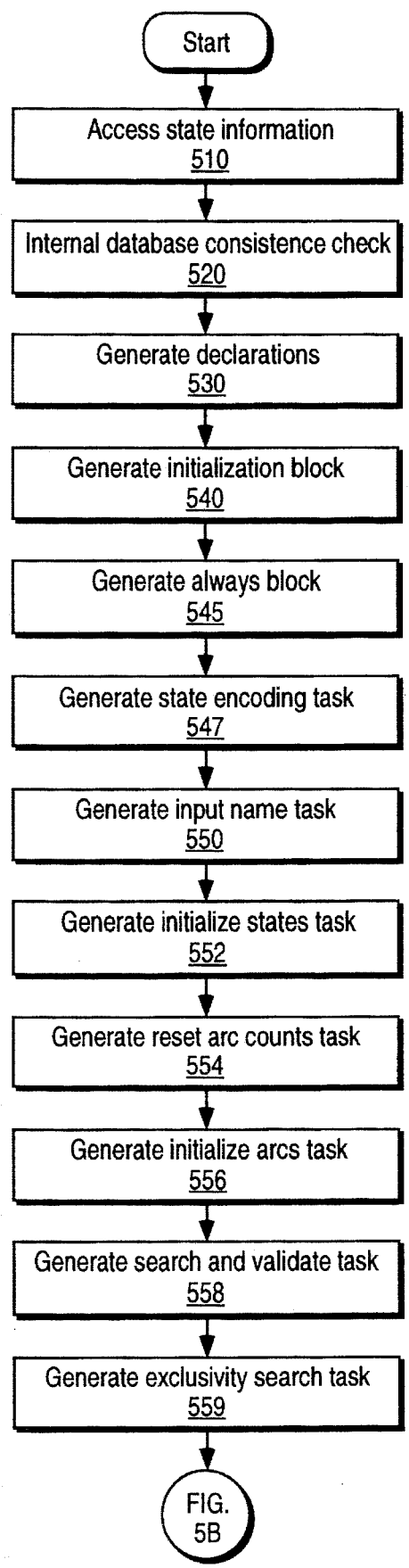
FIG. 5a and FIG. 5b are a flowchart of a method of generating a monitor file.
Figure 5B:
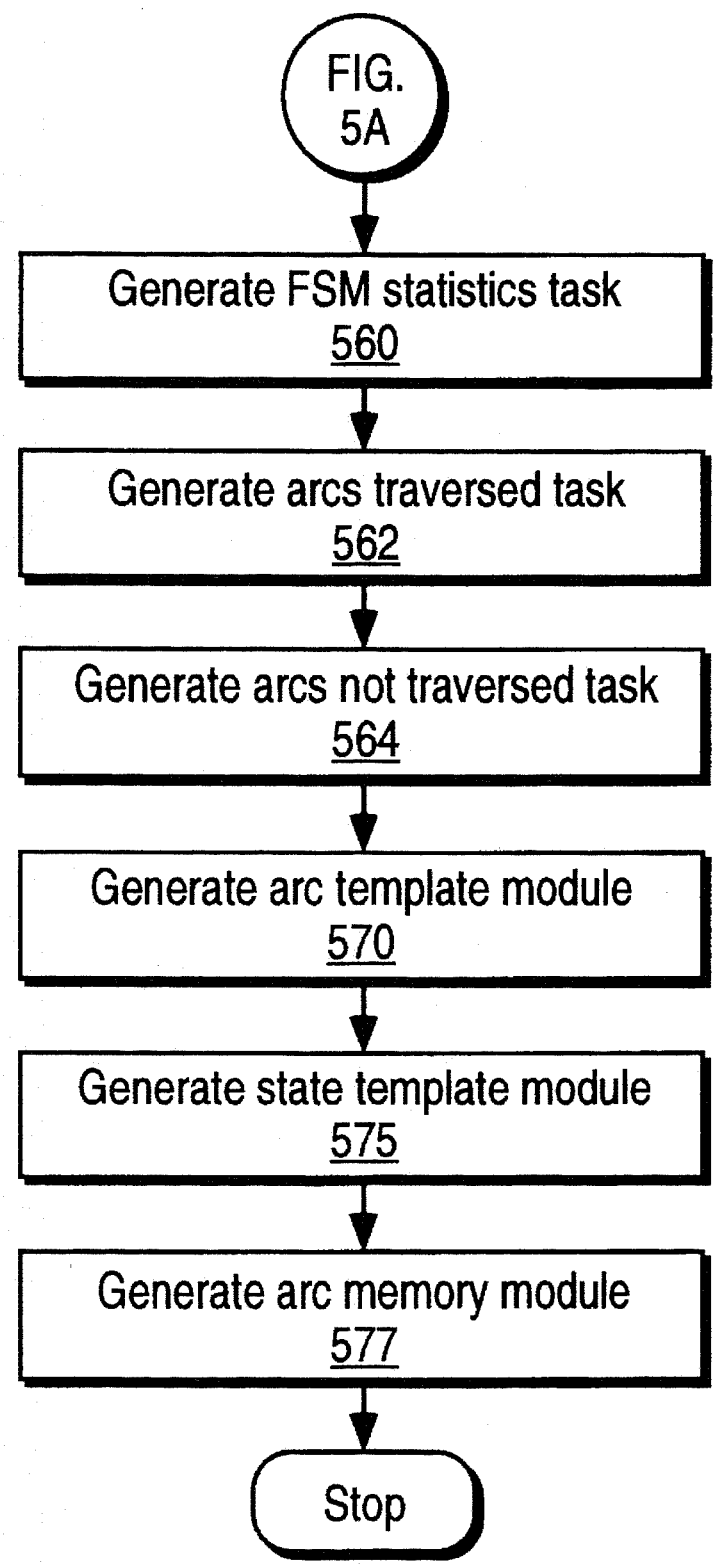

FIG. 5a and FIG. 5b illustrate a method of generating a monitor file. In one embodiment, the file contains code to cause a subsequent simulation of the hardware description to generate the required FSM statistics. This process can be thought of as a program, the FSM monitor generator 350, generating another program, the monitor file 360.

The following method of generating the monitor file 360 does not necessarily require the use of PLIs. This allows the monitor file to execute more quickly. Also, as many vendors' simulators do not fully support PLIs, this embodiment can use more vendors' simulators.

At 510, the state table information is accessed and parsed, as described above. At 520, the internal data structures are generated and an internal database consistency check is performed to determine: whether all the arcs have correct start and end indices; what are the maximum name lengths for the state and input names; and what are the state widths in bits. At 530, declarations are generated in a new monitor file 360. These declaration typically include the number of states and arcs in the FSM. At 540, an initialization block is written to the monitor file 360. At 545, an always block is generated. The always block is a Verilog construct used to execute statements continuously.

Next, a number of tasks are defined. Each task causes some action during the analysis 380. These tasks are used to extract the test coverage information during the simulation. At 547, a state encoding task is generated. This tasks causes the simulator to indicate the encoding of each of the states in the FSM. At 550, the input names tasks is generated. This causes the simulator to write out the input signal names. The initialization states task, at 552, is generated. This task initializes each of the states in the FSM. At 554, the arc counts reset task is generated. This resets the arc counts value to 0 for each of the arcs in the FSM. At 556, the initialize arcs task is generated. This allows the simulator to define the arcs in the FSM. Next, at step 558, the search invalidate task is generated. This task determines whether the current traversed arc is among the list of valid arcs. At 559, the exclusivity search task is generated. This task checks for non-mutually exclusive arcs in the list of valid arcs.

At 560, the FSM statistics task is generated. This task determines which statistics the designer wishes to display in the result file 390, and causes those statistics to be displayed accordingly. At 562, the arcs traversed task is generated. The arcs traversed task causes the simulator to calculate the number of times an arc has been traversed during the simulation, given the test vector file 370. At 564, the arcs not traversed task is generated. This task causes a simulator to count the number of arcs not traversed.

At step 570, the arc template module is generated. This template is used by the simulator to provide a representation of an arc. At 575, the state template module is generated. This provides the simulator with a template of a state. Finally, at 577, the arc memory module is generated. The arc memory module provides the lookup table with the list of all arcs.

Appendix C includes an example of a monitor generator file 360, generated from the state table of Appendix B.

A method and apparatus for analyzing finite state machines (FSM) has been described.

APPENDIX A -
A VERILOG DESCRIPTION OF THE FSM OF FIGURE 2

©1994 Sun Microsystems Inc.

```
5       module machine (x, reset, clock, z);

input x, reset, clock;
        output z;
10      reg     z;

/* Redeclared as reg so they can be assigned to in
        always statements. By default, ports are wires and
15      cannot be assigned to in 'always'
        */

//synopsys state_vector current_state 20      parameter [1:0] /*synopsys enum bus_states*/
                set0 = 2'd0, hold0 = 2'd1, set1 = 2'd2;

reg [1:0] /*synopsys enum bus_states*/
                current_state,next_state;
25
        always @ (x or current_state or reset)
        begin
            z = 0;

30          if (reset == 1'b1)
                next_state = set0;
            else case (current_state) // synopsys full_case
35          /* declared full_case to avoid extraneous latches */
            set0:
                begin
                    z = 0; // set z to 0
                    next_state = hold0;
40              end
            hold0:
                begin
                    z = 0; // hold z at 0
```

```
                    if (x == 1'b0)
                        next_state = hold0;
                    else
                        next_state = set1;
            end
        set1:
            begin
                z = 1; // set z to 1
                next_state = set0;
            end
        default:
            begin
                z = 0;
                next_state = current_state;
            end
        endcase
end always @(posedge clock)
begin
    current_state = next_state;
end endmodule
```

APPENDIX B - EXTRACTED SYNOPSYS™ DESIGN COMPILER STATE TABLE FOR THE FSM OF FIGURE 2

```
.design machine
.inputnames x clock
.outputnames z
.clock clock rising_edge

-       H0    S0    1
-       S0    S1    0
1       S1    H0    0
0       S1    S1    0

.encoding
S0      2#00
H0      2#01
S1      2#10
```

APPENDIX C - MONITOR GENERATOR FILE GENERATED FROM THE STATE TABLE OF APPENDIX B

```
//
// The name of the fsm log file is machine_monitor.log
// The name of the errors file is machine_monitor.errors
//

©1994 Sun Microsystems Inc.

module machine_monitor;

integer i;

integer channel_name;

`define CLOCK_CYCLE 10 parameter num_states = 3;
parameter number_of_arcs = 8;
parameter arc_width = 6;

parameter max_state_name_width = 9;

parameter max_input_names_width = 12;

reg [arc_width:1] temporary_arc;
reg [arc_width:1] x_arc;
reg [31:0] arc_count [number_of_arcs:1];
reg [8*max_state_name_width:1] present_state [number_of_arcs:1];
reg [8*max_state_name_width:1] next_state [number_of_arcs:1];
reg [8*max_input_names_width:1] inputs [number_of_arcs:1];

integer illegal_arcs_count;

integer log_channel;
integer error_channel;
integer files_channel;

integer broadcast;

integer display_arcs;

integer log_transitions;
```

```
machine_monitor_arc_template temp_arc();

machine_monitor_state_template s1();
machine_monitor_state_template s2();
machine_monitor_state_template s3();

machine_monitor_arc_memory arc_mem();

initial
begin
    display_arcs = 0;

log_transitions = 1;

illegal_arcs_count = 0;

if (log_transitions != 0)
    begin
        log_channel = $fopen("machine_monitor.log");
        error_channel = $fopen("machine_monitor.errors");
    end else
    begin
        log_channel = 0;
        error_channel = 0;
    end
    broadcast = 1 | log_channel ;

files_channel = error_channel | log_channel ;

if ((display_arcs != 0) && (log_transitions != 0))
        error_channel = 1 | log_channel | error_channel;
    else if (log_transitions != 0)
        error_channel = log_channel | error_channel;
    else if (display_arcs != 0)
        error_channel = 1 | error_channel;
    temporary_arc  = 6'bx;

// putting in arc info into the arcs
    initialize_arcs;

// putting in state template info
```

```
initialize_states;

if ((display_arcs != 0) && (log_transitions != 0))
begin
        $fdisplay(error_channel,"\t\tFSM MODULE NAME :
top.small_fsm/NewFSM\n");
        $fdisplay(error_channel,"\t\tTime    Pr_St    Nx_st    Inputs");
end else if (log_transitions != 0)
begin
        $fdisplay(files_channel,"\t\tFSM MODULE NAME :
top.small_fsm/NewFSM\n");
        $fdisplay(files_channel,"\t\tTime    Pr_St    Nx_st    Inputs");
end else if (display_arcs != 0)
begin
        $fdisplay( 1,"\t\tFSM MODULE NAME : top.small_fsm/NewFSM\n");
        $fdisplay( 1 ,"\t\tTime    Pr_St    Nx_st    Inputs");
end
end always @(posedge top.small_fsm.clock)
begin
        if (`CLOCK_CYCLE >= 1)
            #(`CLOCK_CYCLE - 1);
        temp_arc.next_state =
            { top.small_fsm.current_state };

// search if the arc exists in the arc list
        // and print it out and notify if illegal
        // and if not, print the number of times this
        // arc has been traversed.
`ifdef EXCLUSIVE
                exclusivity_search;
`else
                search_and_validate;
`endif temp_arc.present_state =
            { top.small_fsm.current_state };
        temp_arc.present_inputs =
            { top.small_fsm.x ,
```

```
          top.small_fsm.reset};
end task state_encodings;

input output_channel;

integer output_channel;
begin
        $fdisplay(output_channel,"\t\tFSM MODULE NAME :
top.small_fsm/NewFSM\n");
    $fdisplay(output_channel,"\t\tState    Encoding\n");
    $fdisplay(output_channel,"\t\tSET_0    00");
    $fdisplay(output_channel,"\t\tHOLD_0   01");
    $fdisplay(output_channel,"\t\tSET_1    10");
    $fdisplay(output_channel,"\n");
    list_input_names(output_channel);
end
endtask task list_input_names;

input output_channel;

integer output_channel;
begin
    $fdisplay(output_channel,"\tInputs are in this order:\n");
    $fdisplay(output_channel,"\t\t1. x\n");
    $fdisplay(output_channel,"\t\t2. reset\n");
    $fdisplay(output_channel,"\n");
end
endtask task initialize_states;
begin
    s1.state = 2'b00;
    s1.begin_index = 4;
    s1.end_index = 5;

s2.state = 2'b01;
    s2.begin_index = 1;
    s2.end_index = 3;

s3.state = 2'b10;
```

```
        s3.begin_index = 6;
        s3.end_index = 8;

end
endtask task reset_arc_counts;
begin
        // initializing arc counts to zero in the respective arcs
        arc_count[1] = 0;
        arc_count[2] = 0;
        arc_count[3] = 0;
        arc_count[4] = 0;
        arc_count[5] = 0;
        arc_count[6] = 0;
        arc_count[7] = 0;
        arc_count[8] = 0;

end
endtask task initialize_arcs;
begin
        // putting in arc info into the respective arcs // The left shifting of inputs is done
        // so that the inputs are left
        // justified when printed out.

arc_count[1] = 0;
        present_state[1] = "HOLD_0";
        next_state[1] = "HOLD_0";
        inputs[1] = " ~x ~reset";
        inputs[1] = inputs[1] << 8*2;
        arc_mem.arc_array[1] = 6'b010001;

arc_count[2] = 0;
        present_state[2] = "HOLD_0";
        next_state[2] = "SET_0";
        inputs[2] = " reset";
        inputs[2] = inputs[2] << 8*5;
        arc_mem.arc_array[2] = 6'b01x100;

arc_count[3] = 0;
        present_state[3] = "HOLD_0";
        next_state[3] = "SET_1";
```

```
            inputs[3] = "  x ~reset";
            inputs[3] = inputs[3] << 8*2;
            arc_mem.arc_array[3] = 6'b011010;

arc_count[4] = 0;
            present_state[4] = "SET_0";
            next_state[4] = "HOLD_0";
            inputs[4] = " ~reset";
            inputs[4] = inputs[4] << 8*5;
            arc_mem.arc_array[4] = 6'b00x001;

arc_count[5] = 0;
            present_state[5] = "SET_0";
            next_state[5] = "SET_0";
            inputs[5] = " reset";
            inputs[5] = inputs[5] << 8*5;
            arc_mem.arc_array[5] = 6'b00x100;

arc_count[6] = 0;
            present_state[6] = "SET_1";
            next_state[6] = "SET_0";
            inputs[6] = " -";
            inputs[6] = inputs[6] << 8*9;
            arc_mem.arc_array[6] = 6'b10xx00;

arc_count[7] = 0;
            present_state[7] = "SET_1";
            next_state[7] = "SET_0";
            inputs[7] = " ~reset";
            inputs[7] = inputs[7] << 8*5;
            arc_mem.arc_array[7] = 6'b10x000;

arc_count[8] = 0;
            present_state[8] = "SET_1";
            next_state[8] = "SET_0";
            inputs[8] = " reset";
            inputs[8] = inputs[8] << 8*5;
            arc_mem.arc_array[8] = 6'b10x100;

end
        endtask task search_and_validate;
        integer i,j, arc_found_index;
        reg arc_found, invalid_arc;
```

```
begin
    invalid_arc = 1;

arc_found_index = 0;

temporary_arc = { temp_arc.present_state,
                      temp_arc.present_inputs,
                      temp_arc.next_state };

if ((temporary_arc[6:5] == s1.state) || (^(s1.state) === 1'bx))
    begin
        for (i = s1.begin_index; i <= s1.end_index; i = i + 1)
        begin
            x_arc = arc_mem.arc_array[i];
            if (((temporary_arc[6:5] == x_arc[6:5]) ||
                 (^x_arc[6:5] === 1'bx)) &&
                ((temporary_arc[2:1] == x_arc[2:1]) ||
                 (^x_arc[2:1] === 1'bx)))
            begin
                if (^x_arc[4:3] === 1'bx)
                begin
                    arc_found = 1;
                    for(j = 4; j >= 3; j = j - 1)
                    begin
                        if (x_arc[j] !== 1'bx)
                        begin
                            if (temporary_arc[j] != x_arc[j])
                                arc_found = 0;
                        end
                    end
                    if (arc_found != 0)
                    begin
                        invalid_arc = 0;
                        arc_count[i] = arc_count[i] + 1;
                        arc_found_index = i;
                        i = s1.end_index;
                    end
                end
                else if (temporary_arc[4:3] == x_arc[4:3])
                begin
                    invalid_arc = 0;
                    arc_count[i] = arc_count[i] + 1;
                    arc_found_index = i;
                    i = s1.end_index;
                end
```

```
                    end
                end
            end else if ((temporary_arc[6:5] == s2.state) ||    (^(s2.state) === 1'bx))
            begin
                for (i = s2.begin_index; i <= s2.end_index; i = i + 1)
                begin
                    x_arc = arc_mem.arc_array[i];
                    if (((temporary_arc[6:5] == x_arc[6:5]) ||
                        (^x_arc[6:5] === 1'bx)) &&
                        ((temporary_arc[2:1] == x_arc[2:1]) ||
                        (^x_arc[2:1] === 1'bx)))
                    begin
                        if (^x_arc[4:3] === 1'bx)
                        begin
                            arc_found = 1;
                            for(j = 4; j >= 3; j = j - 1)
                            begin
                                if (x_arc[j] !== 1'bx)
                                begin
                                    if (temporary_arc[j] != x_arc[j])
                                        arc_found = 0;
                                end
                            end
                            if (arc_found != 0)
                            begin
                                invalid_arc = 0;
                                arc_count[i] = arc_count[i] + 1;
                                arc_found_index = i;
                                i = s2.end_index;
                            end
                        end
                        else if (temporary_arc[4:3] == x_arc[4:3])
                        begin
                            invalid_arc = 0;
                            arc_count[i] = arc_count[i] + 1;
                            arc_found_index = i;
                            i = s2.end_index;
                        end
                    end
                end
            end else if ((temporary_arc[6:5] == s3.state) ||    (^(s3.state) === 1'bx))
            begin
```

```
for (i = s3.begin_index; i <= s3.end_index; i = i + 1)
  begin
        x_arc = arc_mem.arc_array[i];
        if (((temporary_arc[6:5] == x_arc[6:5]) ||
           (^x_arc[6:5] === 1'bx)) &&
           ((temporary_arc[2:1] == x_arc[2:1]) ||
           (^x_arc[2:1] === 1'bx)))
          begin
                if (^x_arc[4:3] === 1'bx)
                  begin
                     arc_found = 1;
                     for(j = 4; j >= 3; j = j - 1)
                     begin
                         if (x_arc[j] !== 1'bx)
                           begin
                              if (temporary_arc[j] != x_arc[j])
                                  arc_found = 0;
                           end
                     end
                     if (arc_found != 0)
                     begin
                         invalid_arc = 0;
                         arc_count[i] = arc_count[i] + 1;
                         arc_found_index = i;
                         i = s3.end_index;
                     end
                  end
                else if (temporary_arc[4:3] == x_arc[4:3])
                  begin
                     invalid_arc = 0;
                     arc_count[i] = arc_count[i] + 1;
                     arc_found_index = i;
                     i = s3.end_index;
                  end
          end
  end
end if (invalid_arc == 1)
begin
      $fwrite(error_channel,"%d\t%b\t%b\t%b",
         $time, temporary_arc[6 : 5], temporary_arc[2 : 1],
         temporary_arc[4 : 3]);

$fwrite(error_channel," *** WARNING! ILLEGAL ARC detected in
FSM : top.small_fsm/NewFSM ***\n\n");
```

```
                illegal_arcs_count = illegal_arcs_count + 1;
        end
        else
        begin
            if ((display_arcs != 0) && (log_transitions != 0))
                $fdisplay(broadcast,"%d %s %s %s",
                    $time, present_state[arc_found_index],
                    next_state[arc_found_index],
                    inputs[arc_found_index]);
            else if (log_transitions != 0)
                $fdisplay(log_channel,"%d %s %s %s",
                    $time, present_state[arc_found_index],
                    next_state[arc_found_index],
                    inputs[arc_found_index]);
            else if (display_arcs != 0)
                $fdisplay( 1 ,"%d %s %s %s",
                    $time, present_state[arc_found_index],
                    next_state[arc_found_index],
                    inputs[arc_found_index]);
        end
    end
endtask task exclusivity_search;
integer i, j, arc_found_index, number_of_arcs_found;
reg arc_found, invalid_arc;

reg traversed_arc[number_of_arcs : 1];

begin
    invalid_arc = 1;

arc_found_index = 0;

number_of_arcs_found = 0;

for (i = 1; i <= number_of_arcs; i = i + 1)
        traversed_arc[i] = 0;

temporary_arc = { temp_arc.present_state,
            temp_arc.present_inputs,
            temp_arc.next_state };

if ((temporary_arc[6:5] == s1.state) || (^(s1.state) === 1'bx))
    begin
```

```
for (i = s1.begin_index; i <= s1.end_index; i = i + 1)
begin
    x_arc = arc_mem.arc_array[i];
    if ((temporary_arc[6:5] == x_arc[6:5]) ||
        (^x_arc[6:5] === 1'bx))
        begin
            if (^x_arc[4:3] === 1'bx)
                begin
                    arc_found = 1;
                    for(j = 4; j >= 3; j = j - 1)
                    begin
                        if (x_arc[j] !== 1'bx)
                        begin
                            if (temporary_arc[j] != x_arc[j])
                                arc_found = 0;
                        end
                    end
                    if (arc_found != 0)
                    begin
                        invalid_arc = 0;
                        arc_count[i] = arc_count[i] + 1;
                        number_of_arcs_found = number_of_arcs_found + 1;
                        traversed_arc[i] = 1;
                    end
                end
            else if (temporary_arc[4:3] == x_arc[4:3])
                begin
                    invalid_arc = 0;
                    arc_count[i] = arc_count[i] + 1;
                    number_of_arcs_found = number_of_arcs_found + 1;
                    traversed_arc[i] = 1;
                end
        end
    end
end if ((temporary_arc[6:5] == s2.state) || (^(s2.state) === 1'bx))
begin
    for (i = s2.begin_index; i <= s2.end_index; i = i + 1)
    begin
        x_arc = arc_mem.arc_array[i];
        if ((temporary_arc[6:5] == x_arc[6:5]) ||
            (^x_arc[6:5] === 1'bx))
            begin
                if (^x_arc[4:3] === 1'bx)
                    begin
```

```
                            arc_found = 1;
                            for(j = 4; j >= 3; j = j - 1)
                            begin
                                if (x_arc[j] !== 1'bx)
                                begin
                                    if (temporary_arc[j] != x_arc[j])
                                        arc_found = 0;
                                end
                            end
                            if (arc_found != 0)
                            begin
                                invalid_arc = 0;
                                arc_count[i] = arc_count[i] + 1;
                                number_of_arcs_found = number_of_arcs_found + 1;
                                traversed_arc[i] = 1;
                            end
                        end
                        else if (temporary_arc[4:3] == x_arc[4:3])
                          begin
                                invalid_arc = 0;
                                arc_count[i] = arc_count[i] + 1;
                                number_of_arcs_found = number_of_arcs_found + 1;
                                traversed_arc[i] = 1;
                          end
                    end
                end
        end
end if ((temporary_arc[6:5] == s3.state) || (^(s3.state) === 1'bx))
begin
        for (i = s3.begin_index; i <= s3.end_index; i = i + 1)
        begin
                x_arc = arc_mem.arc_array[i];
                if ((temporary_arc[6:5] == x_arc[6:5]) ||
                   (^x_arc[6:5] === 1'bx))
                    begin
                        if (^x_arc[4:3] === 1'bx)
                        begin
                            arc_found = 1;
                            for(j = 4; j >= 3; j = j - 1)
                            begin
                                if (x_arc[j] !== 1'bx)
                                begin
                                    if (temporary_arc[j] != x_arc[j])
                                        arc_found = 0;
                                end
```

```
                        end
                    if (arc_found != 0)
                    begin
                        invalid_arc = 0;
                        arc_count[i] = arc_count[i] + 1;
                        number_of_arcs_found = number_of_arcs_found + 1;
                        traversed_arc[i] = 1;
                    end
                end
                else if (temporary_arc[4:3] == x_arc[4:3])
                    begin
                        invalid_arc = 0;
                        arc_count[i] = arc_count[i] + 1;
                        number_of_arcs_found = number_of_arcs_found + 1;
                        traversed_arc[i] = 1;
                    end
            end
        end
end if (invalid_arc == 1)
begin
    $fwrite(error_channel,"%d\t%b\t%b\t%b",
        $time, temporary_arc[6 : 5], temporary_arc[2 : 1],
        temporary_arc[4 : 3]);

$fwrite(error_channel," *** WARNING! ILLEGAL ARC detected in
FSM : top.small_fsm/NewFSM ***\n\n");
    illegal_arcs_count = illegal_arcs_count + 1;
end
else if (number_of_arcs_found == 1)
begin
    if ((display_arcs != 0) && (log_transitions != 0))
        for (i = 1; i <= number_of_arcs; i = i + 1)
        begin
            if (traversed_arc[i] != 0)
            $fdisplay(broadcast,"%d %s %s %s",
                $time, present_state[i],
                next_state[i],
                inputs[i]);
        end
    else if (log_transitions != 0)
        for (i = 1; i <= number_of_arcs; i = i + 1)
        begin
            if (traversed_arc[i] != 0)
            $fdisplay(log_channel,"%d %s %s %s",
```

```
                $time, present_state[i],
                next_state[i],
                inputs[i]);
            end
        else if (display_arcs != 0)
            for (i = 1; i <= number_of_arcs; i = i + 1)
            begin
                if (traversed_arc[i] != 0)
                $fdisplay( 1 ,"%d %s %s %s",
                    $time, present_state[i],
                    next_state[i],
                    inputs[i]);
            end
        end
        else
        begin
            $fwrite(error_channel,"\n\t*******************************\n\n");
            $fwrite(error_channel," *** WARNING! Exclusivity error detected in
FSM : top.small_fsm/NewFSM ***\n");
            $fwrite(error_channel," *** For present state and inputs the next state is
not unique ***\n");
            $fwrite(error_channel," *** Report file will increment counts of all arcs
possible   ***\n");
            $fwrite(error_channel," *** Report file may be incorrect
***\n");
            $fwrite(error_channel," *** Possible arcs here are: \n\n");
            for (i = 1; i <= number_of_arcs; i = i + 1)
            begin
                if (traversed_arc[i] != 0)
                    $fwrite(error_channel,"%d\t%s\t%s\t%s\n",
                        $time, present_state[i],
                        next_state[i],
                        inputs[i]);
            end
            $fwrite(error_channel,"\n\t*******************************\n\n");
            $fwrite(error_channel,"\n");
        end
    end
endtask task fsm_stats;
input output_channel;

integer output_channel;
```

```
parameter arc_width = 6;

integer i, traversed;
reg [arc_width : 1] x_arc;

begin if ((display_arcs != 0) && (log_transitions != 0))
            output_channel = 1 | log_channel | output_channel;

else if (log_transitions != 0)
        output_channel = log_channel | output_channel;

else if (display_arcs != 0)
        output_channel = 1;

traversed = 0;
    $fdisplay(output_channel);

$fdisplay(output_channel,"\t************************************************
*******************");
    $fdisplay(output_channel);

state_encodings(output_channel);
    $fdisplay(output_channel,"\t\tSTATISTICS FOR THE FSM\n");
    for (i = 1; i <= number_of_arcs; i = i + 1)
    begin
        x_arc = arc_mem.arc_array[i];
        $fdisplay(output_channel,"%d times  %s  %s  %s",
            arc_count[i], present_state[i], next_state[i], inputs[i]);
        if (arc_count[i] != 0)
            traversed = traversed + 1;
    end
    if (illegal_arcs_count == 1)
        $fdisplay(output_channel,
            "\n%d ILLEGAL ARC WAS TRAVERSED\n", illegal_arcs_count);
    else
        $fdisplay(output_channel,
            "\n%d ILLEGAL ARCS WERE TRAVERSED\n",
illegal_arcs_count);
    $fdisplay(output_channel);
    $fdisplay(output_channel);
    $fdisplay(output_channel,"\n\n%d ARCS OUT OF A TOTAL %d ARCS
WERE TRAVERSED",
```

```
                        traversed, number_of_arcs);
            $fdisplay(output_channel);

$fdisplay(output_channel,"\t*************************************
******************");
            $fdisplay(output_channel);
end
endtask task arcs_traversed;
input output_channel;

integer output_channel;

parameter arc_width = 6;

integer i, traversed;
reg[arc_width:1] x_arc;

begin if ((display_arcs != 0) && (log_transitions != 0))
                output_channel = 1 | log_channel | output_channel;

else if (log_transitions != 0)
            output_channel = log_channel | output_channel;

else if (display_arcs != 0)
            output_channel = 1 | output_channel;

traversed = 0;
        $fdisplay(output_channel);

$fdisplay(output_channel,"\t*************************************
******************");
        $fdisplay(output_channel);

state_encodings(output_channel);
        $fdisplay(output_channel,"\t\tARCS TRAVERSED");
        $fdisplay(output_channel);
        for (i = 1; i <= number_of_arcs; i = i + 1)
        begin
                x_arc = arc_mem.arc_array[i];
```

```
            if (arc_count[i] != 0)
            begin
                $fdisplay(output_channel,"%d times  %s  %s  %s",
                        arc_count[i], present_state[i], next_state[i],
                        inputs[i]);
                traversed = traversed + 1;
            end
        end
        $fdisplay(output_channel,"\n\n%d ARCS OUT OF A TOTAL %d ARCS WERE TRAVERSED",
                traversed, number_of_arcs);
        $fdisplay(output_channel);

$fdisplay(output_channel,"\t************************************************************");
        $fdisplay(output_channel);
    end
endtask task arcs_not_traversed;
input output_channel;

integer output_channel;

parameter arc_width = 6;

integer i, untraversed;
reg[arc_width:1] x_arc;

begin if ((display_arcs != 0) && (log_transitions != 0))
            output_channel = 1 | log_channel | output_channel;

else if (log_transitions != 0)
        output_channel = log_channel | output_channel;

else if (display_arcs != 0)
        output_channel = 1 | output_channel;

untraversed = 0;
    $fdisplay(output_channel);
```

```
$fdisplay(output_channel,"\t***************************************
*****************");
    $fdisplay(output_channel);

state_encodings(output_channel);
    $fdisplay(output_channel,"\t\tARCS NOT TRAVERSED");
    $fdisplay(output_channel);
    for (i = 1; i <= number_of_arcs; i = i + 1)
    begin
        x_arc = arc_mem.arc_array[i];
        if (arc_count[i] == 0)
        begin
            $fdisplay(output_channel,"\t%s  %s  %s",
                present_state[i], next_state[i],
                inputs[i]);
            untraversed = untraversed + 1;
        end
    end
    $fdisplay(output_channel,"\n\n%d ARCS OUT OF A TOTAL %d ARCS
WERE NOT TRAVERSED",
            untraversed, number_of_arcs);
    $fdisplay(output_channel);

$fdisplay(output_channel,"\t***************************************
*****************");
    $fdisplay(output_channel);
end
endtask
endmodule module machine_monitor_arc_template;

parameter state_width = 2;
parameter input_width = 2;
reg [state_width : 1] present_state;
reg [state_width : 1] next_state;
reg [input_width : 1] present_inputs;
reg [26 : 1] name;
integer traversed;

endmodule
```

```
module machine_monitor_state_template;

parameter state_width = 2;

reg[state_width : 1] state;
integer begin_index, end_index;

endmodule module machine_monitor_arc_memory;

parameter arc_width = 6;
parameter number_of_arcs = 8;

reg [arc_width - 1 : 0] arc_array [1 : number_of_arcs];

endmodule
```

What is claimed is:

1. A computer system for generating a summary of test coverage for a hardware description, said hardware description corresponding to a finite state machine (FSM), said computer system comprising:

a) a memory for storing said hardware description and a predetermined test vector, and b) a processor, coupled to said memory, using said hardware description, generates state information corresponding to said FSM, said processor, using said state information, generates a first description, said first description including a description for monitoring states and signals in said hardware description, and said processor, using said test vector, said hardware description and said first description, generates said test coverage summary.

2. The computer system of claim 1 wherein said hardware description includes a Verilog description, and said first description includes tasks.

3. The computer system of claim 1 wherein said hardware description includes a VHDL description.

4. The computer system of claim 1 wherein said processor generates said state information by executing a Synopsys™ design compiler.

5. The computer system of claim 1 wherein said processor further accesses a second summary, and said processor further generates a third summary corresponding to said summary, and said second summary.

6. The computer system of claim 1 wherein said processor generates said first description by executing a FSM generator, and wherein said first description includes:

declarations;
   initialization data;
   always data;
   a state encoding task;
   an input name task;
   an initialization states task;
   a reset arc counts task;
   an initialize arcs task;
   a search and validate task;
   an exclusivity search task;
   a FSM statistics task;
   an arcs traversed task;
   an arcs not traversed task;
   an arc template module;
   a state template module, and
   an arc memory module.

7. The computer system of claim 1 wherein said processor executes an analysis process to generate said test coverage summary.

8. A computer implemented method of determining a number of states accessed and a number of arcs traversed in a finite state machine (FSM), said finite state machine corresponding to a hardware description, said method comprising the steps of:

a) accessing said hardware description;

b) generating state information from said hardware description;

c) generating a monitor description responsive to generating said state information, said monitor description for monitoring states and signals in said hardware description;

d) simulating the function of said hardware using said hardware description, said monitor description and driver data, said driver data including stimuli for said simulating, and e) generating a set of results including said number of states accessed and said number of arcs traversed in said FSM, responsive to said step of simulating.

9. The method of claim 8 wherein said computer system includes a processor, and wherein said processor executes a design compiler to generate said state information, said processor executes a FSM monitor generator to generate said monitor description, said processor executes a simulator to generate said set of results.

10. The method of claim 8 further comprising the steps of:

accessing a second set of results, said second set of results corresponding to second driver data, and generating a third set of results corresponding to said set of results and said second set of results, said third set of results including a total number of states accessed, and a total number of arcs traversed.

11. The method of claim 8 wherein said step of generating said monitor description includes:

accessing said state information, and
    performing a consistency check.

12. The method of claim 8 wherein said step of generating said monitor description includes:

generating declarations;
    generating an initialization block;
    generating always data;
    generating a state encoding task;
    generating an input name task;
    generating an initialization states task;
    generating a reset arc counts task;
    generating an initialize arcs task;
    generating a search and validate task;
    generating an exclusivity search task;
    generating a FSM statistics task;
    generating an arcs traversed task;
    generating an arcs not traversed task;
    generating an arc template module;
    generating a state template module, and
    generating an arc memory module.

13. The method of claim 8 wherein said step of generating said state information includes said processor executing a compiler and providing said design compiler with said hardware description and a script, said script including data to cause said processor to automatically generate said state information.

14. The method of claim 8 wherein said hardware description includes Verilog code, and said monitor description includes Verilog code.

15. The method of claim 8 wherein said processor generates said state information by executing a Synopsys™ design compiler.

16. A method for determining the sufficiency of testing a finite state machine (FSM) during a computer simulation of a hardware description, said hardware description defining an said FSM, said method including the steps of:

a) extracting a state table from said hardware description, said state table corresponding to said FSM;

b) generating monitor description data, said monitor description data including commands to trace signals in said hardware description;

c) simulating said FSM using said hardware description, a predetermined test vector and said monitor description data, and f) generating a report responsive to said simulating step, said report including a number of states accessed value and a number of arcs traversed value in said FSM, said number of states accessed value and said number of arcs traversed value indicating a sufficiency of testing said FSM.

17. The method of claim 16 further comprising the steps of:

accessing a second report, said second report including a number of states accessed value and a number of arcs traversed value in said FSM for second driver data;

accessing a third report, said third report including a number of states accessed value and a number of arcs traversed value in said FSM for third driver data, and generating a fourth report, said fourth report including a cumulative number of states accessed value and a cumulative number of arcs traversed value, said cumulative number of states accessed value and said cumulative number of arcs traversed value indicating the sufficiency of testing of said FSM by said driver data, said second driver data and said third driver data.

* * * * *